United States Patent
Beaman et al.

(10) Patent No.: US 6,278,614 B1
(45) Date of Patent: Aug. 21, 2001

(54) EXPANSION CARD RETENTION APPARATUS AND METHOD

(75) Inventors: Daniel Paul Beaman, Cedar Park; M. Lawrence Buller; Brian Michael Kerrigan, both of Austin; John Richard Pugley, Round Rock, all of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/316,755

(22) Filed: May 21, 1999

(51) Int. Cl.[7] .................................................... H05K 5/00
(52) U.S. Cl. ..................... 361/752; 361/825; 361/801; 211/41.17; 211/41.26; 248/22.51; 248/22.52
(58) Field of Search ................................... 361/724, 752, 361/753, 796, 797, 776, 801, 825, 690, 686, 697, 683; 439/701; 211/41.17, 41.26; 248/222.51, 222.52; 312/223.2

(56) References Cited

U.S. PATENT DOCUMENTS

| | | | |
|---|---|---|---|
| 4,602,829 | 7/1986 | De Andrea | 312/320 |
| 5,317,483 | 5/1994 | Swindler | 361/801 |
| 5,575,546 | 11/1996 | Radloff | 312/183 |
| 5,579,210 | 11/1996 | Ruhland et al. | 361/816 |
| 5,601,349 | 2/1997 | Holt | 312/265.6 |
| 5,640,309 | 6/1997 | Carney et al. | 361/801 |
| 5,673,175 | 9/1997 | Carney et al. | 361/686 |
| 5,690,306 | 11/1997 | Roesner | 248/222.52 |
| 5,694,291 | * 12/1997 | Feightner | 361/683 |
| 5,706,173 | 1/1998 | Carney et al. | 361/740 |
| 5,748,453 | 5/1998 | Carney et al. | 361/801 |
| 5,757,618 | 5/1998 | Lee | 361/686 |
| 5,856,632 | 1/1999 | Bostrom et al. | 174/35 |

* cited by examiner

Primary Examiner—Jeffrey Gaffin
Assistant Examiner—Thanh Y. Tran
(74) Attorney, Agent, or Firm—Joseph P. Lally; J. Bruce Schelkopf

(57) ABSTRACT

A computer system including a computer chassis that includes a rear panel is provided. The rear panel defines a set of expansion card slots. A printed circuit board is received within the chassis includes a set of expansion card connectors aligned to the set of expansion card slots. A card retention bracket of the system includes first and second plates joined at a common end. The second plate extends substantially perpendicularly from the first plate. The first plate is adapted for being removably attached to an interior surface of the rear panel of the chassis such that the second plate extends exterior to the chassis. The second plate includes a set of card retention tabs including at least one retention tab corresponding to each expansion card slot. The retention tabs are positioned within the second plate to align an expansion card to a corresponding expansion slot and to restrict movement of the expansion card when the retention bracket first plate is attached to the rear panel of the chassis and placed in a set position. In one embodiment, the first plate includes a single hole, such as a thumbscrew that is operable with the aid of screwdrivers or other tools, for fastening the first plate to the chassis rear panel via a single fastener. In one embodiment, the retention tabs are arranged in pairs where each pair of tabs corresponds to a corresponding expansion card slot. In this arrangement, a first tab of each pair of tabs is oriented parallel to the first plate to restrict movement of the expansion card in a plane perpendicular to the chassis rear panel when the retention bracket is properly attached to the rear panel. The second tab of each pair is oriented perpendicular to the first plate to restrict movement of the expansion board in a plane approximately parallel to the rear panel. Preferably, the retention bracket including the retention tabs comprises a single piece of formed sheet metal.

13 Claims, 4 Drawing Sheets

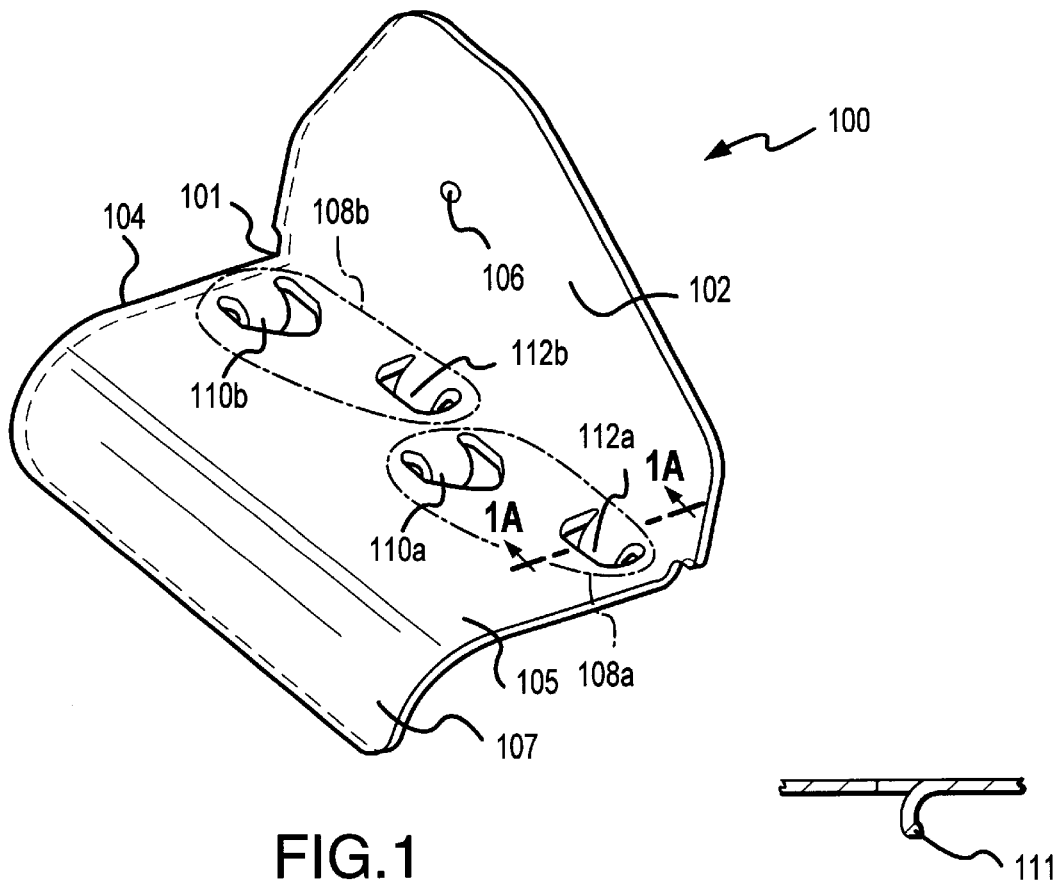
FIG.1
FIG.1A
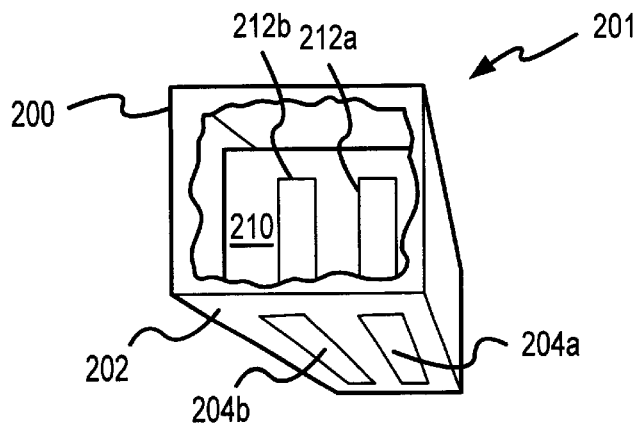
FIG.3

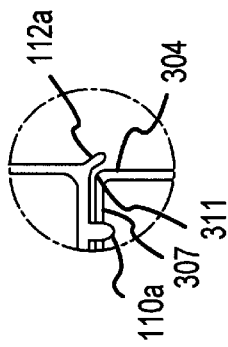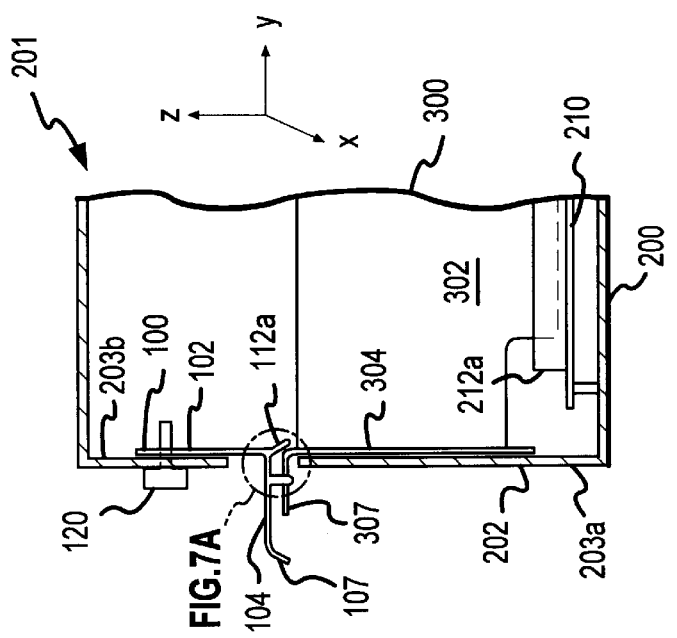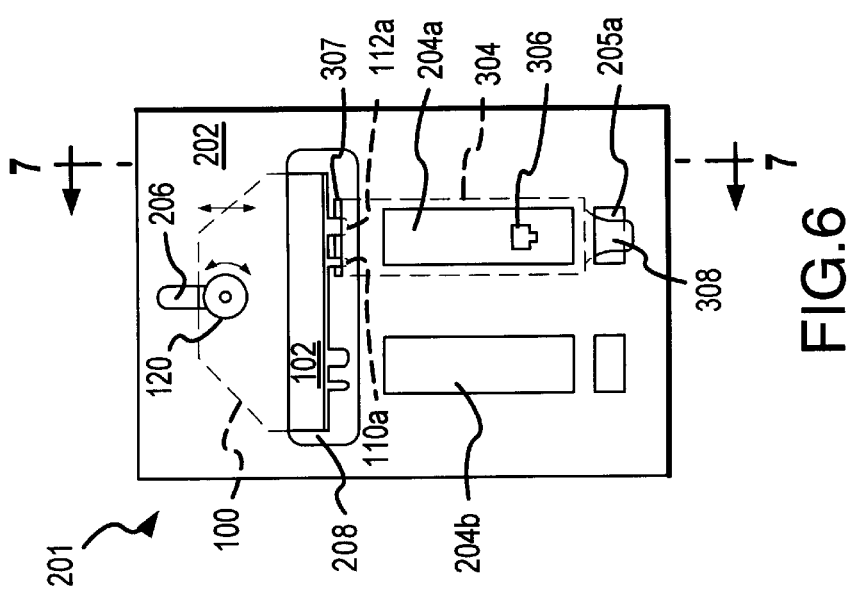

EXPANSION CARD RETENTION APPARATUS AND METHOD

BACKGROUND

1. Field of the Present Invention

The present invention generally relates to the field of computer systems and more particularly to hardware and methods designed to secure computer system expansion cards in their respective connector sockets.

2. History of Related Art

Microprocessor based computer systems typically require or include facilities for connecting one or more expansion cards to the system. Expansion cards extend the capabilities of computer systems by providing dedicated hardware to achieve a variety of tasks. Graphics adapters, high speed network controllers, hard disk controllers, sound cards, and modem cards are among some of the more common types of expansion cards although those knowledgeable in the field of computer systems will recognize a wide variety of other types of expansion cards.

Typically, expansion cards are interfaced to the microprocessor (or microprocessors in a multi-processor system) by physically inserting the expansion card into an expansion card connector. In many cases, the expansion card includes facilities for making an external connection to the expansion card. A network adapter card, as an example, typically includes a socket for connecting an external cable to the adapter card. The expansion card must be maintained in a precise position such that the socket is accessible. Moreover, because external connections to expansion cards are achieved by incorporating expansion slots in the chassis of a computer system, it is important to maintain the portion of the expansion card that includes the socket or other external connector in close proximity to the chassis to minimize the gap between the expansion card and the chassis. In addition, it is important to maintain the positioning of expansion cards within their respective expansion card connector during system operation to insure reliable operation. Those familiar with expansion cards and expansion cards connectors will appreciate the ease with which a slight displacement or movement of the expansion card can result in a faulty connection. Thus, maintaining precise positioning of expansion cards is a an important issue in the design and manufacturing of computer systems. Historically, the secure positioning of expansion cards was maintained by screwing each expansion card into place with one or more securing screws. Unfortunately, the use of separate screws to secure each expansion board undesirably increases the amount of time and effort required to install, remove, replace, and otherwise service the expansion cards in a system.

A significant amount of effort has been devoted to simplifying the means by which the positioning of expansion cards is maintained. See, for example, Feightner (U.S. Pat. No. 5,694, 291) incorporating an intricately fabricated bracket apparatus to secure add-on cards in "Baby-AT" type computers; Carney (U.S. Pat. No. 5,706,173) disclosing a support and protective plate mechanism for engaging PCI cards; Carney (U.S. Pat. No. 5,673,175) teaching a complex, hinged, "double door" retainer for use with PCI cards; Lee (U.S. Pat. No. 5,575,618) reciting a cover member for securing expansion cards; Carney (U.S. Pat. No. 5,640,309) disclosing a clip mechanism for retaining PCI cards; and Holt (U.S. Pat. No. 5,601,349) disclosing a "captive latch" device for use with an expansion card cage. Unfortunately, these inventions typically require highly intricate clips, hinges, or bracket structures that introduce an undesirably expensive piece of hardware to the system component list. In addition, these inventions are typically effective at limiting expansion card movement in only one or two orthogonal directions. It would be highly desirable to introduce an easily manufactured and inexpensive expansion card retention mechanism that overcomes the limitations of the prior art.

SUMMARY OF THE INVENTION

The problems identified above are in large part addressed by a computer system including an expansion card retention bracket that secures expansion cards such as PCI cards in their respective socket connectors. The invention secures expansion cards in the preferred embodiment with a single piece of stamped sheet metal secured with a single thumbscrew. In the preferred embodiment, the invention aligns expansion cards to their respective expansion slots and restrains expansion card movement in three directions.

Broadly speaking the invention contemplates a computer system including an expansion card retention bracket. The system includes a computer chassis that includes a rear panel. The rear panel defines a set of expansion card slots. A printed circuit board is received within the chassis. The printed circuit board includes a set of expansion card connectors aligned to the set of expansion card slots. The system further includes a card retention bracket. The bracket has first and second plates that are joined at a common end. The second plate extends substantially perpendicularly from the first plate such that the bracket is L-shaped. The first plate is adapted for being removably attached to an interior surface of the rear panel of the chassis such that the second plate extends exterior to the chassis. The second plate includes a set of card retention tabs including at least one retention tab corresponding to each expansion card slot. The retention tabs are positioned within the second plate to align an expansion card to a corresponding expansion slot and to restrict movement of the expansion card when the retention bracket first plate is attached to the rear panel of the chassis and placed in a set position. In one embodiment, the first plate includes a single hole suitable for receiving a fastener, such as a thumbscrew that is operable without the aid of screwdrivers or other tools, for fastening the first plate to the chassis rear panel. In one embodiment, the rear panel further includes a vertical positioning slot suitable for receiving the single fastener. The positioning slot permits adjustment of the vertical position of the retention bracket when the single fastener is loosened such that the bracket may be moved from a set position, in which the retention tabs are in proximity to their corresponding expansion cards, to a clear position in which the retention tabs are vertically displaced from the expansion cards. In one embodiment, the retention tabs are arranged in pairs where each pair of tabs corresponds to a corresponding expansion card slot. In this arrangement, a first tab of each pair of tabs is oriented parallel to the first plate to restrict movement of the expansion card in a plane perpendicular to the chassis rear panel when the retention bracket is properly attached to the rear panel. The second tab of each pair is oriented perpendicular to the first plate to restrict movement of the expansion board in a plane approximately parallel to the rear panel. Preferably, the retention bracket including the retention tabs comprises a single piece of formed sheet metal. In one embodiment, the chassis rear panel further defines an entry slot suitable for receiving the second plate of the retention bracket when the first plate is attached to an interior surface of the chassis rear panel. In one embodiment, the second plate terminates in a flange at an end opposite the common end. The flange is suitable for gripping or handling the card retention bracket.

The present invention further contemplates a method of installing, removing, or replacing expansion cards in a computer system by loosening a single fastener accessible from an exterior of the computer system. The loosening is preferably achieved by hand where the single fastener is a thumbscrew. A card retention bracket is then moved from a set position to a clear position by moving a first plate of the bracket that is removably attached to the rear panel in a vertical direction until retention tabs formed in a second plate of the card retention bracket are clear of expansion cards received within a expansion card connectors of the computer system. After the bracket is clear of the expansion cards, the cards may be removed, preferably by hand, from their respective expansion card connectors. The method may further include inserting a second expansion card in a second expansion card connector while the retention bracket is maintained in the clear position. After installation or replacement of the appropriate expansion cards, the retention bracket is moved from the clear position to a set position by moving the first plate downward towards the expansion card until the retention tabs are in close proximity to the expansion card. The single fastener is then tightened until the retention bracket maintains the set position without assistance.

BRIEF DESCRIPTION OF THE DRAWINGS

Other objects and advantages of the invention will become apparent upon reading the following detailed description and upon reference to the accompanying drawings in which:

FIG. 1 is perspective drawing of an expansion card retention bracket according to an embodiment of the present invention;

FIG. 1A is a cross-sectional of a portion of the expansion card retention bracket of FIG. 1;

FIG. 3 is a perspective view of a computer system according to the present invention revealing an interior portion of the system;

FIG. 6 is a front plan view of the computer system of the present invention with an expansion card inserted and the retention bracket in its set position;

FIG. 7 is a partial cross sectional side view of the computer system according to the present invention in which an expansion board has been inserted; and FIG. 7A is a detailed view of a portion of the computer system of FIG. 7.

Figure 2:
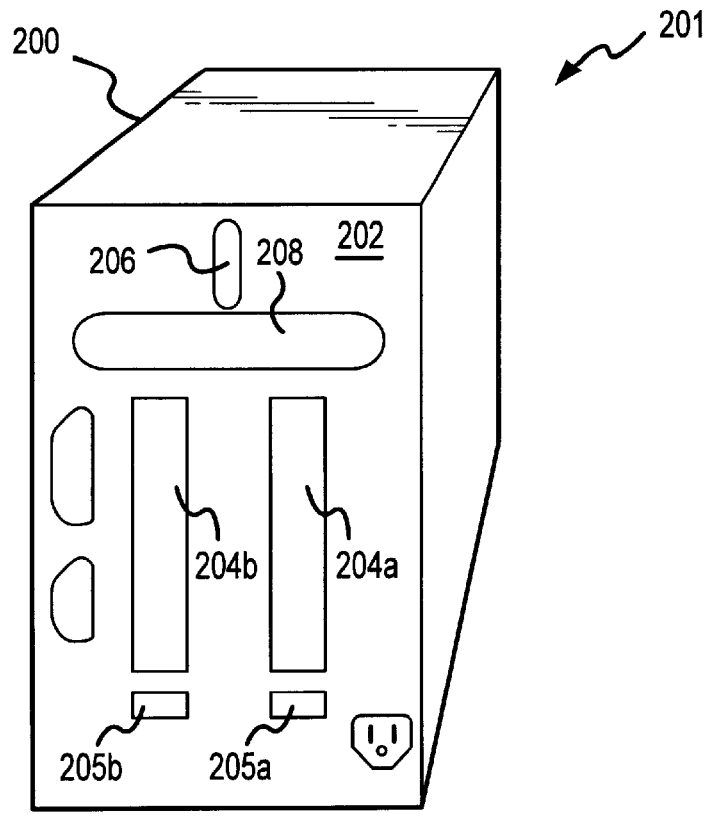
FIG. 2 is a perspective view of a computer system chassis according to an embodiment of the present invention.

While the invention is susceptible to various modifications and alternative forms, specific embodiments thereof are shown by way of example in the drawings and will herein be described in detail. It should be understood, however, that the drawings and detailed description presented herein are not intended to limit the invention to the particular embodiment disclosed, but on the contrary, the intention is to cover all modifications, equivalents, and alternatives falling within the spirit and scope of the present invention as defined by the appended claims.

DETAILED DESCRIPTION OF A PREFERRED EMBODIMENT OF THE PRESENT INVENTION

Turning now to the drawings, FIG. 1 is a perspective view of one embodiment of a expansion card retention bracket 100 according to the present invention. In the depicted embodiment, card retention bracket 100 is an L-shaped bracket that includes a first plate 102 and a second plate 104. In the preferred embodiment, first and second plates 102 and 104 share a common end 101 from which the plates extend substantially perpendicularly to one another. In one embodiment, second plate 104 includes a planar portion 105 and a flange 107 that curves away from the plane defined by planar portion 105 in a direction opposite the direction in which first plate 102 extends from second plate 104. In this embodiment, flange 107 is suitable as a handle useful for gripping card retention bracket 100.

First plate 102 of card retention bracket 100 is suitably designed to be removably attachable to a panel such as a piece of sheet metal or other material suitable for use a computer chassis. In one embodiment, first panel 102 includes a single fastening hole 106 suitable for receiving a single fastener such as a thumbscrew or other fastening device. Planar portion 105 of second plate 104 includes a set of card retention tabs indicated in FIG. 1 by reference numerals 110a, 110b, 112a, and 112b (generically or collectively referred to as retention tabs 110 and 112. Each card retention tab 110 and 112 is attached to second plate 104 and extends away from the plane defined by planar portion 105 of second plate 104. In the depicted embodiment, retention tabs 110 and 112 extend away from second plate 104 in a direction opposite the direction in which first plate 102 extends away from first plate 104. Each retention tab 110 and 112 in the depicted embodiment is formed with a curvature that terminates in a contact point 111 (depicted in FIG. 1A) suitable for retaining a structure with which the tab 110 or 112 is in contact. In an embodiment suitable for its low cost and ease of manufacture, card retention bracket 100 is fabricated as a single piece of stamped sheet metal or other similar material.

The set of retention tabs of the embodiment of card retention bracket 100 depicted in FIG. 1 include a set of retention tab groups 108a and 108b (generically or collectively referred to herein as retention tab group or groups 108). Although the figure indicates two groups 108, it will be readily apparent to one skilled in the field having the benefit of this disclosure that the number of groups 108 may be more (or less) than the two groups 108a and 108b shown. Each retention tab group 108 includes a pair of retention tabs, namely, a first retention tab 110 and a second retention tab 112. Each first retention tab 110 is oriented parallel to the plane defined by first plate 102 while each second retention tab 112 is oriented approximately 90° with respect to first tab 110 such that each second retention tab 112 is oriented perpendicular to the plane defined by first plate 102. Each retention tab 110 and 112 is suitable for restricting or preventing movement in a direction of the tab's orientation. Thus, each first tab 110 is suitable for restricting or preventing movement in a plane parallel to first plate 102 while each second tab 112 is suitable for restricting or preventing movement in a plane perpendicular to first plate 102.

Turning now to FIG. 2 and 3, simplified depictions of a computer system 201 according to the present invention are presented. Computer system 201 includes a computer system chassis 200 that includes a rear panel 202. Chassis 200 is preferably fabricated of sheet metal or other suitable material desirable for is low cost and EMF shielding capabilities. In one embodiment, rear face 202 of computer chassis 200 includes a set of expansion card slots 204a and 204b (generically or collectively referred to herein as expansion slot or slots 204). In one embodiment of computer system 201, the number of expansion slots 204 in chassis 200 corresponds to the number of retention tab groups 108 in second plate 104 of retention bracket 100. As indicated earlier with respect to the number of tab groups 108, the number of expansion slots 204 in rear panel 202 may be more or less than the two slots depicted in the figures. Computer system 201, as shown in FIG. 3, further includes a printed circuit board 210 received within chassis 200. Printed circuit board 210 preferably includes a set of expansion card connectors 212. Each connector 212 is aligned with a corresponding expansion slot 204 of rear panel 202 and is suitable for receiving an expansion card. In one embodiment, the printed circuit board 210 may include the microprocessor or microprocessors of computer system 201. In another embodiment, printed circuit board 210 may be an expansion board that is received within a connector on a motherboard (not shown) of the system 201. Referring to the embodiment depicted in FIG. 2, rear panel 202 may further include a vertical positioning slot 206 and an entry slot 208 for fastening and adjusting the vertical position of retention bracket 100. In addition, rear panel 202 may further include secondary openings 205 located below corresponding expansion slots 204.

Figure 4:
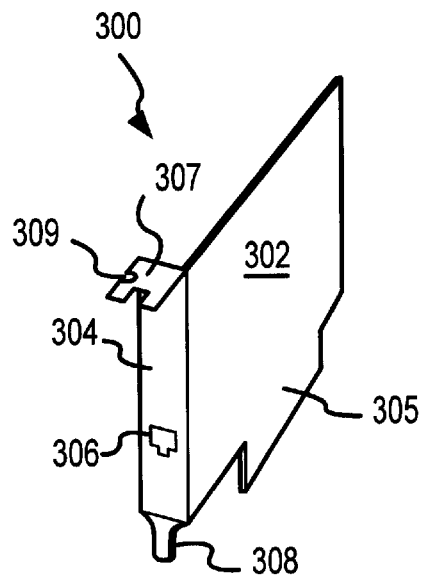
FIG. 4 is a perspective drawing of an expansion card for use with the computer system of the present invention.

The invention contemplates a method and hardware for preventing expansion cards from becoming dislodged during normal system operation and use. Turning briefly to FIG. 4, a representative expansion card 300 is depicted. The embodiment of expansion card 300 depicted in FIG. 4 preferably includes a printed circuit board 302 that typically includes multiple electronic components (not depicted) attached thereto. The components are electrically interconnected to one another via a plurality of conductive interconnects that are fabricated into printed circuit board 302 according to well known printed circuit board manufacturing techniques. In addition, the depicted embodiment of expansion card 300 includes an expansion card brace 304 that is attached to an end of printed circuit board 302 and substantially perpendicular to board 302. Expansion card brace 304 is preferably comprised of sheet metal or steel and may include an opening suitable for receiving a connecting device such as the socket 306 depicted in FIG. 4. Brace 304, in one embodiment, includes a plate 307 that is formed at a substantially right angle to brace 304 and may include one or more notches 309. The printed circuit board 302 of expansion card 300 preferably further includes a connector portion 305 that extends beyond the perimeter of the remaining portion of circuit board 302. Connector portion 305 typically includes a plurality of gold plated connector fingers that make electrical contacts to corresponding contacts in an expansion card connector 212 when expansion card 300 is received within a connector 212 of circuit board 210. It will be appreciated to those familiar with microprocessor based computer systems that the arrangement of circuit board 210, expansion connectors 212 and expansion slots 204 are designed such that expansion card brace 304 is aligned to an expansion slot 204 and in contact with or in very close proximity to rear panel 202 when expansion card 300 is inserted or received in a corresponding connector 212. In this manner, expansion cards provide the physical support for an external connection as well as the dedicated hardware designed to pass information between or control the device, system, network, attached to connector 306. In one embodiment of the invention, the physical and electrical characteristics of expansion card 300 are compliant with an industry standard I/O bus specification such as PCI Local Bus Specification Rev. 2.2 available from the PCI Special Interest Group, 575 NE Kathryn St. #17, Hillsboro, Oreg. 97124 and incorporated by reference herein. In one embodiment, expansion brace 304 may further include a tongue 308 suitable for being received in a secondary opening 205 (shown if FIG. 2) as illustrated below in FIG. 6 below.

Figure 5:
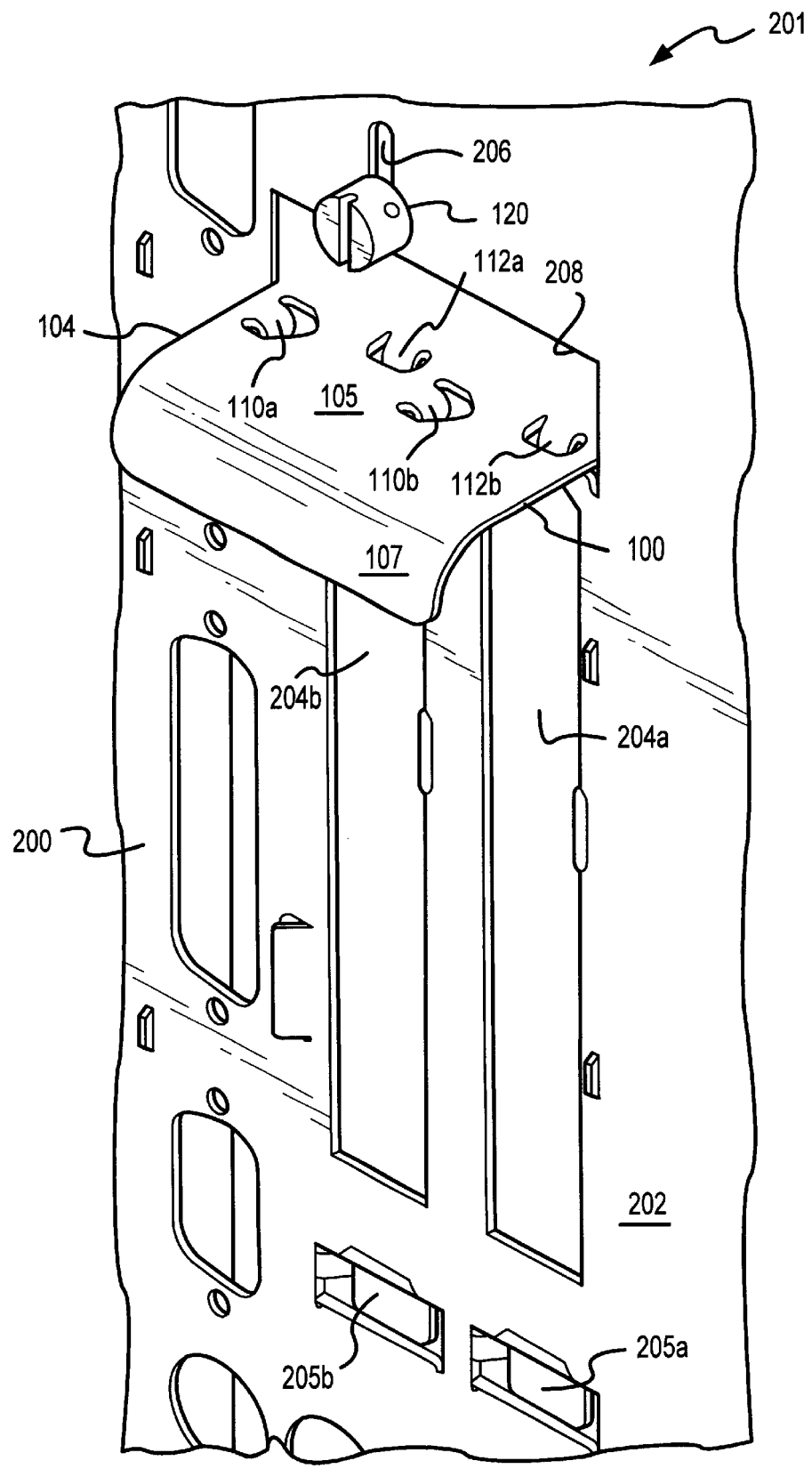
FIG. 5 is a partial perspective view of an exterior surface of a rear panel of the computer system according to the present invention.

Turning now to FIG. 5, a perspective view of an exterior portion of computer system 201 is presented. System 201, as depicted in FIG. 5, includes chassis 200 and card retention bracket 100. In the preferred embodiment, first plate 102 is attached to an interior surface (not visible from the perspective of FIG. 5) of rear panel 202 while second plate 104 of card retention bracket 100 extends exterior to chassis 200 through entry slot 208 in rear panel 202 when first plate 102 (also not visible from the perspective of FIG. 5) is attached to the interior surface of rear panel 202 using a fastener such as thumbscrew 120 inserted into vertical positioning slot 206 and through the fastening hole in first plate 102. With retention bracket 100 attached to rear panel 202 in this manner, retention tabs 110 and 112 are in alignment with respective expansion slots 204 in rear panel 202. Vertical positioning slot 206 and entry slot 208 permit adjustment of the vertical positioning of retention bracket 100. By loosening thumbscrew 120, retention bracket 100 may be moved from a "set" position, in which retention tabs 110 and 112 are in position to contact and restrict or prevent movement of an expansion card 300 (not shown if FIG. 5), to a "clear" position, in which the retention tabs are vertically displaced above the upper edge of any expansion card.

Turning now to FIGS. 6 and 7, a front view and a partial cross sectional side view of computer system 201 are presented in which an expansion card 300 has been inserted into a first expansion connector 212a and retention bracket 100 has been placed in its set position. With expansion card 300 appropriately installed in connector 212a, expansion card brace 304 is aligned to expansion slot 204a and in contact with or in close proximity to an interior surface 203b of rear panel 202 with plate 307 of expansion card brace 304 extending through entry slot 208 to the exterior of chassis 200. With first plate 102 of retention bracket 100 attached to an interior surface 203b of rear panel 202 via the single fastener 120, second plate 104 of retention bracket 100 also extends through rear panel 202 via entry slot 208 to the exterior of chassis 200. The positioning and orientation of retention tabs 110a and 112a in second plate 104 places the tabs in close proximity to expansion card 300 when retention bracket 100 is in the set position. More specifically, first retention tab 110a is positioned and oriented wherein first tab 110a "catches" notch 309 (as shown in FIG. 4) of plate 307 and prevents movement of circuit board 302 in a plane parallel to rear panel 202. Second tab 112a is positioned and oriented to contact expansion card brace 304 at an elbow 311 of expansion card brace 304 (as shown in FIG. 7A) and retains contact brace 304 in close proximity to interior surface 203b of rear panel 202 thereby preventing movement of expansion card 300 in a plane perpendicular to rear panel 202 (i.e., a plane parallel to the plane of the cross-sectional view of FIG. 7). Moreover, the vertical position of brace 304 and plate 307 are maintained by retention bracket 100 when bracket 100 is in its set (i.e., downward) position. Accordingly, retention bracket 100 provides an effective mechanism for restraining movement of expansion card 300 in the x, y, and z directions indicated in FIG. 7 where first retention tab 110 restricts movement in the x direction, second tab 112 prevents movement in the y direction and the vertical position of bracket 100 prevents movement in the z direction.

The embodiment of expansion card 300 depicted in FIG. 6 further includes a tongue portion 308 of expansion card brace 304 that extends through secondary opening 205a in rear panel 202 to provide anchoring of expansion card 300 opposite plate 307. With the expansion card retention system depicted in FIGS. 1 through 7, the invention contemplates a method of installing, removing, and replacing one or multiple expansion cards 300 in a computer system. By loosening the fastener by which retention bracket 100 is affixed to rear panel 202, bracket 100 may be raised up within entry slot 208 and vertical positioning slot 206 to a clear position in which the retention tabs are clear of their corresponding expansion cards 300. In the embodiment depicted in FIGS. 5 through 7, in which thumbscrew 120 serves as the fastener, the loosening of the fastener can be accomplished by hand without the use of any screwdrivers or other tools. Thumbscrew 120 in the preferred embodiment is externally accessible as indicated in FIGS. 6 and 7. After loosening the fastener and raising retention bracket 100 to a position in which retention tabs 110 and 112 are clear of plate 307 of expansion card brace 304, each expansion card 300 may be removed from its connector 212 by hand. Expansion bracket 100 may be secured in its cleared position by tightening the fastener to keep the bracket out of the way while expansion cards are being removed, installed, or replaced. In this fashion, retention bracket 100 remains with chassis 200 thereby reducing the likelihood of losing or misplacing bracket 100. After appropriate removal, installation, or replacement of desired expansion cards 300 in their appropriate connectors 212, retention bracket 100 may be lowered into its set position, with its retention tabs 110 and 112 in contact with or close proximity to plate 307 of expansion card brace 304, and fixed in the set position by tightening the fastener. Thus, in the preferred embodiment, the installation, removal, and replacement of one or more expansion cards 300 is accomplished by simply loosening and tightening a single fastener. In addition, the retention of the expansion cards 300 is achieved, in the preferred embodiment, with a single piece of stamped sheet metal.

It will be apparent to those skilled in the art having the benefit of this disclosure that the present invention contemplates securing and retaining expansion cards of a computer system in their respective expansion connectors with a minimum of fastening hardware. It is understood that the form of the invention shown and described in the detailed description and the drawings are to be taken merely as presently preferred examples. It is intended that the following claims be interpreted broadly to embrace all the variations of the preferred embodiments disclosed.

What is claimed is:

1. A computer system comprising:
   a chassis including a rear panel, wherein the rear panel defines a set of expansion card slots;
   a printed circuit board received within the chassis, wherein the printed circuit board includes a set of expansion card connectors aligned to the set of expansion card slots;
   a card retention bracket comprising first and second plates joined at a common end, the second plate extending substantially perpendicularly from the first plate, wherein the first plate is adapted for being removably attached to an interior surface of the rear panel of the chassis such that the second plate extends exterior to the chassis and wherein the second plate includes a set of card retention tabs including at least one retention tab corresponding to each expansion card slot, wherein the retention tabs are positioned within the second plate to align each expansion card received in an expansion card connector to its corresponding expansion slot and to restrict movement of each expansion card when the retention bracket first plate is attached to the rear panel of the chassis and the bracket is in a set position; and
   wherein the set of retention tabs includes a pair of tabs corresponding to each expansion card slot and wherein a first tab of each pair of tabs is oriented parallel to the first plate to restrict movement of the expansion card in a plane perpendicular to the rear panel when the first plate is attached to the chassis rear plate and wherein a second tab of each pair is oriented perpendicular to the first plate to restrict movement of the expansion board in a plane approximately parallel to the rear panel.

2. The system of claim 1, wherein the first plate includes a single hole for fastening the first plate to the chassis rear panel via a single fastener.

3. The system of claim 2, wherein the single fastener comprises a thumbscrew.

4. The system of claim 2, wherein the rear panel further includes a vertical positioning slot suitable for receiving the single fastener thereby permitting adjustment of the vertical position of the retention bracket when the single fastener is loosened.

5. The system of claim 1, wherein the expansion card comprises a printed circuit board and an expansion card brace affixed to and substantially perpendicular to an end of the printed circuit board, wherein the brace is aligned with and in close proximity to one of the expansion card slots when the printed circuit board is received within a corresponding expansion card connector and further wherein one of the retention tabs maintains the brace in close proximity to the chassis rear panel.

6. The system of claim 1, wherein the retention bracket including the retention tabs comprise a single piece of formed sheet metal.

7. The system of claim 1, wherein the chassis rear panel further defines an entry slot suitable for receiving the second plate of the retention bracket when the first plate is attached to the interior surface of the chassis rear panel.

8. The system of claim 1, wherein the expansion card connectors are suitable for receiving PCI expansion cards.

9. The system of claim 1, wherein the second plate terminates in a flange at an end opposite the common end suitable for gripping the card retention bracket.

10. An expansion card retention bracket for use with a computer system, comprising first and second plates joined at a common end, the second plate extending substantially perpendicularly from the first plate, wherein the first plate is adapted for being removably attached to a rear panel of the computer system chassis, and wherein the second plate includes a set of card retention tabs including at least one retention tab corresponding to each expansion card slot of the chassis rear panel, wherein each retention tab is positioned within the second plate align an expansion card to its corresponding expansion slot and to restrict movement of the expansion card when the expansion card is received in the expansion card slot wherein the set of retention tabs includes a pair of tabs corresponding to each expansion card slot and wherein a first tab of each pair of tabs is oriented parallel to the first plate to restrict movement of the expansion card in a plane perpendicular to the rear panel when the first plate is attached to the chassis rear plate and wherein a second tab of each pair is oriented perpendicular to the first plate to restrict movement of the expansion board in a plane approximately parallel to the rear panel.

11. The bracket of claim 10, wherein the first plate includes a single hole for fastening the first plate to the chassis rear panel via a single fastener.

12. The bracket of claim 10, wherein the retention bracket including the retention tabs comprise a single piece of formed sheet metal.

13. The bracket of claim 10, wherein the second plate terminates in a flange at an end opposite the common end, wherein the flange is suitable for gripping the card retention bracket.

* * * * *